(12) United States Patent
Yeom et al.

(10) Patent No.: US 7,919,142 B2
(45) Date of Patent: Apr. 5, 2011

(54) ATOMIC LAYER DEPOSITION APPARATUS USING NEUTRAL BEAM AND METHOD OF DEPOSITING ATOMIC LAYER USING THE SAME

(75) Inventors: Geun-Young Yeom, Seoul (KR); Do-Haing Lee, Gyeonggi-do (KR); Byoung-Jae Park, Gyeryong-si (KR); Kyeong-Joon Ahn, Gimpo-si (KR)

(73) Assignee: Sungkyunkwan University Foundation for Corporate Collaboration, Suwon (KR)

( * ) Notice: Subject to any disclaimer, the term of this patent is extended or adjusted under 35 U.S.C. 154(b) by 1128 days.

(21) Appl. No.: 11/348,471

(22) Filed: Feb. 7, 2006

(65) Prior Publication Data
US 2006/0213443 A1 Sep. 28, 2006

(30) Foreign Application Priority Data

Mar. 22, 2005 (KR) .................. 10-2005-0023782

(51) Int. Cl.
*C23C 16/00* (2006.01)
*C23C 14/28* (2006.01)
*C23C 14/30* (2006.01)
*H05B 6/00* (2006.01)
*H05B 7/00* (2006.01)

(52) U.S. Cl. .................. 427/248.1; 427/595; 427/596

(58) Field of Classification Search ............... 427/248.1, 427/595, 596
See application file for complete search history.

(56) References Cited

FOREIGN PATENT DOCUMENTS
JP 62-291032 12/1987
JP 2003-092291 3/2003

OTHER PUBLICATIONS

Grigoriev et al., Broad fast neutral molecule beam sources for industrial-scale beam-assisted depostion, Surface Coatings and Technology, 156 (2002) pp. 44-49.*
Goeckner et al., "Reduction of Residual Charge in Surface-Neutralization Beams," $2^{nd}$ International Symposium on Plasma Process-Induced Damage, May 13-14, 1997, 5 Sheets.
Oakes et al., "Selective, Anisotropic and Damage-Free $SIO_2$ Etching with a Hyperthermal Atomic Beam," Physical Sciences, Inc., Plasma Etch Users Group Conference, Jan. 2000, 8 Sheets.
Yunogami et al., "Development of Neutral-Beam-Assisted Etcher," Central Research Laboratory, J. Vac. Sci. Technol., vol. 13, No. 3, American Vacuum Society, May\Jun. 1995, pp. 952-958.

* cited by examiner

*Primary Examiner* — Timothy H Meeks
*Assistant Examiner* — Kelly M Gambetta
(74) *Attorney, Agent, or Firm* — Foley & Lardner LLP

(57) ABSTRACT

Disclosed are an atomic layer deposition apparatus using a neutral beam and a method of depositing an atomic layer using the apparatus, capable of converting an ion beam into a neutral beam and radiating it onto a substrate to be treated. The method uses an apparatus for supplying a first reaction gas containing a material that cannot be chemisorbed onto a substrate to be treated into a reaction chamber in which the substrate is loaded, and forming a first reactant adsorption layer containing a material that cannot be chemisorbed onto the substrate; and radiating a neutral beam generated by the second reaction gas onto the substrate on which the first reactant adsorption layer is formed, and removing a material not chemisorbed onto the substrate from the first reactant adsorption layer to form a second reactant adsorption layer. It is possible to perform a process without damage due to charging with the apparatus for depositing an atomic layer using a neutral beam and the method of depositing an atomic layer using the apparatus.

9 Claims, 4 Drawing Sheets

ATOMIC LAYER DEPOSITION APPARATUS USING NEUTRAL BEAM AND METHOD OF DEPOSITING ATOMIC LAYER USING THE SAME

BACKGROUND OF THE INVENTION

1. Field of the Invention

The present invention relates to an atomic layer deposition apparatus using a neutral beam and a method of depositing an atomic layer using the apparatus, and more particularly, to an atomic layer deposition apparatus using a neutral beam and a method of depositing an atomic layer using the apparatus in which a second reaction gas is ionized to form plasma, and a resulting flux of radicals, i.e. an ion beam, is neutralized and radiated onto a substrate to be treated.

2. Description of the Prior Art

Due to increasing demand for highly integrated semiconductor devices, recent years have seen continuous reduction of a semiconductor integrated circuit design rule to the point of a critical dimension not more than 90 nm. Nowadays, in order to implement such nanometer-scale semiconductor devices, ion enhancement equipment such as a high density plasma apparatus, a reactive ion etcher, and so on are being widely used. However, such equipment may cause physical and electrical damage to a semiconductor substrate or a specific material layer on the semiconductor substrate, since it involves vast quantities of ions for performing an etching (or deposition) process colliding with the semiconductor substrate or specific material layer with hundreds eV of energy.

For example, the surface layer of a crystalline substrate or a specific material layer bombarded with ions may be converted into an amorphous layer, some incident ions are adsorbed or some components of the bombarded material layer are selectively decomposed, so that the chemical composition of an etched (or deposited) surface layer is changed. In addition, atomic bonds of the surface layer are damaged by the bombardment, thereby becoming dangling bonds. Such dangling bonds may cause physical or electrical damage to the material, or give rise to charge-up damage of a gate insulating layer or electrical damage by notching of polysilicon due to charging of photoresist. In addition to such physical and electrical damage, there occurs either surface contamination caused by a chamber material, or surface contamination caused by reaction gases such as C—F polymers generated when using a CF-based reaction gas.

Therefore, since the physical/electrical damage caused by such ions in the nanometer-scale semiconductor devices decreases reliability and productivity of the semiconductor devices, it is required to develop an innovative semiconductor etching (or depositing) apparatus and method that may be applied in the future according to the trend of the high integration of the semiconductor devices and resulting reduction of the design rule.

As an example of such requirement, D. B. Oakes et al. propose a damage-free etching technology using a hyperthermal atomic beam in the paper titled "Selective, Anisotropic and Damage-Free SiO$_2$ Etching with a Hyperthermal Atomic Beam." As another example, Takashi Yunogami et al. propose a silicon oxide etching technology with little damage using a neutral beam and a neutral radical in the paper titled "Development of Neutral-Beam-Assisted Etcher" (J. Vac. Sci. Technol. A 13(3), May/June, 1995). For still another example, M. J. Goeckner et al. propose an etching technology using an overheated, charge-free neutral beam instead of plasma in the paper titled "Reduction of Residual Charge in Surface-Neutralization-Based Beams" (2$^{nd}$ International Symposium on Plasma Process-Induced Damage, May 13-14, 1997, Monterey, Calif.).

In the process of fabricating the semiconductor devices, a sputtering method, a chemical vapor deposition (CVD) method, and an atomic layer deposition (ALD) method are generally employed in order to uniformly deposit a thin layer. In the sputtering method, an inert gas such as argon is converted into plasma to sputter a target surface, thereby forming a highly pure, thin layer having excellent adhesion. However, the sputtering method makes it very difficult to obtain uniformity across the entire thin layer.

In the CVD method, most widely used nowadays, various gases are supplied and induced by high energy in the form of intense heat, light, or plasma to chemically react to form a thin layer of desired thickness. While CVD has the advantages of excellent step coverage and high yield, a temperature of the thin layer during its formation is very high, and the thickness of the thin layer cannot be controlled to a precision of several Å. In addition, since at least two kinds of reaction gas are simultaneously supplied into a reactor, particles may be generated, which may be a source of contamination.

Meanwhile, in the ALD method, a reaction gas and a purge gas are alternately supplied to deposit a thin layer one atomic layer unit at a time. The precise thickness control afforded by the atomic layer units is suggested to overcome the limitations of CVD in scaled-down semiconductor processes requiring ever thinner layers. Using ALD, it is possible to obtain a thin layer having a uniform thickness that can be finely adjusted to a precision of an atomic layer unit, and suppress generation of particles, a source of contamination.

However, the ALD process makes also use of a second reaction gas that is injected to induce reaction at high temperature, or that is ionized to convert a flux of plasma. At this time, charging due to ions or electrons may occur as a result of using the plasma. In addition, when the second reaction gas is injected as is, a second reaction gas process performed at high temperature is added to the ALD process.

Further, while a method of using remote plasma has been developed to solve the problem of charging, in such a method, flux and energy may be reduced.

SUMMARY

The present invention provides an atomic layer deposition (ALD) apparatus using a low-temperature neutral beam formed with energetic radicals (overheated). The beam may be generated by reflecting energetic ions at a reflective body, re-bonding, or charge exchange, and can be adapted to an ALD process, especially a second reaction gas process.

The present invention also provides a method of depositing an atomic layer without charging a second reaction gas by plasma ions, i.e., without electrical damage, by ionizing and neutralizing the second reaction gas before radiating it onto a substrate to be treated.

The present invention further provides a method of depositing an atomic layer using a neutral beam without charging a second reaction gas, by using an electrically neutral flux of radicals which have higher energy than conventional remote plasma.

According to an aspect of the present invention, there is provided an apparatus for depositing an atomic layer using a neutral beam including: an ion source extracting an ion beam having a polarity from a gas injected through an inlet; a reaction chamber into which a gas can be injected through the inlet, and that can locate a substrate to be treated on a path of the neutral beam; a grid assembly located at one end of the ion source and having a plurality of grid holes accelerating a specific polarity of ion beam; and a reflective body having a plurality of reflective body holes or slits corresponding to the grid holes of the grid assembly, and reflecting the ion beam passing through the grid holes inside the reflective body holes or the slits to convert the ion beam into a neutral beam, wherein a first reaction gas is injected into the reaction chamber to react with the substrate, and then a second reaction gas is injected through the inlet of the ion source to be converted into a neutral beam and radiated onto the substrate.

According to another aspect of the present invention, there is provided a method of depositing an atomic layer using a neutral beam including: supplying a first reaction gas containing a material that cannot be chemisorbed onto a substrate to be treated into a reaction chamber in which the substrate is loaded, and forming a first reactant adsorption layer containing a material that cannot be chemisorbed onto the substrate; and radiating a neutral beam generated from the second reaction gas onto the substrate on which the first reactant adsorption layer is formed, and removing a material not chemisorbed onto the substrate from the first reactant adsorption layer to form a second reactant adsorption layer.

According to still another aspect of the present invention, there is provided a method of depositing an atomic layer using a neutral beam that enables deposition of a single atomic layer containing Si, nitride, metal oxide, or a metal layer, the method comprising: supplying a first reaction gas containing a material that cannot be chemisorbed onto a substrate to be treated into a reaction chamber in which the substrate is loaded, and forming a first reactant adsorption layer containing a material that cannot be chemisorbed onto the substrate; and radiating a neutral beam generated by the second reaction gas onto the substrate on which the first reactant adsorption layer is formed, and removing a material not chemisorbed onto the substrate from the first reactant adsorption layer to form a second reactant adsorption layer.

BRIEF DESCRIPTION OF THE DRAWINGS

The above and other objects, features and advantages of the present invention will become more apparent from the following detailed description taken in conjunction with the accompanying drawings, in which.

DETAILED DESCRIPTION OF EXEMPLARY EMBODIMENTS

Figure 1:
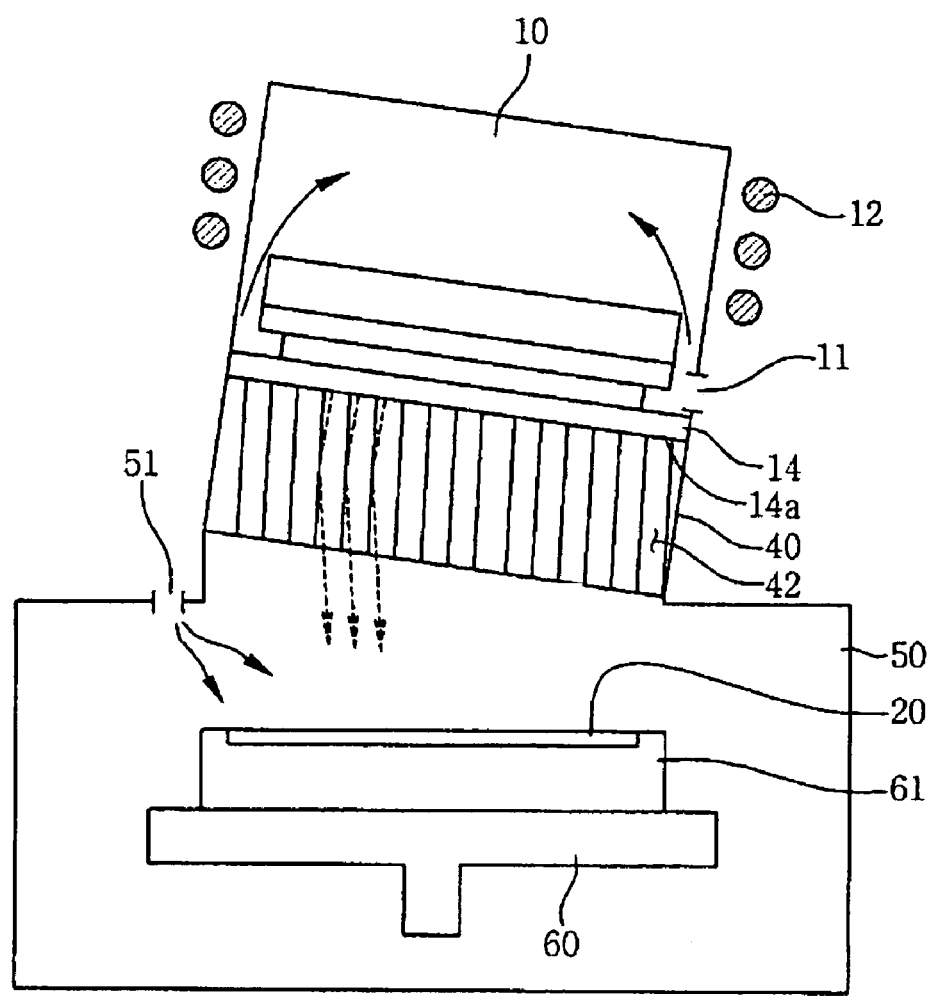
FIG. 1 is a schematic diagram illustrating an apparatus for depositing an atomic layer using a neutral beam in accordance with an exemplary embodiment of the present invention.

Hereinafter, exemplary embodiments of the present invention will be described with reference to the accompanying drawings. In the following description and the drawings, the same reference numerals are used to designate the same or similar components, and such components will be described only once.

Figure 2:
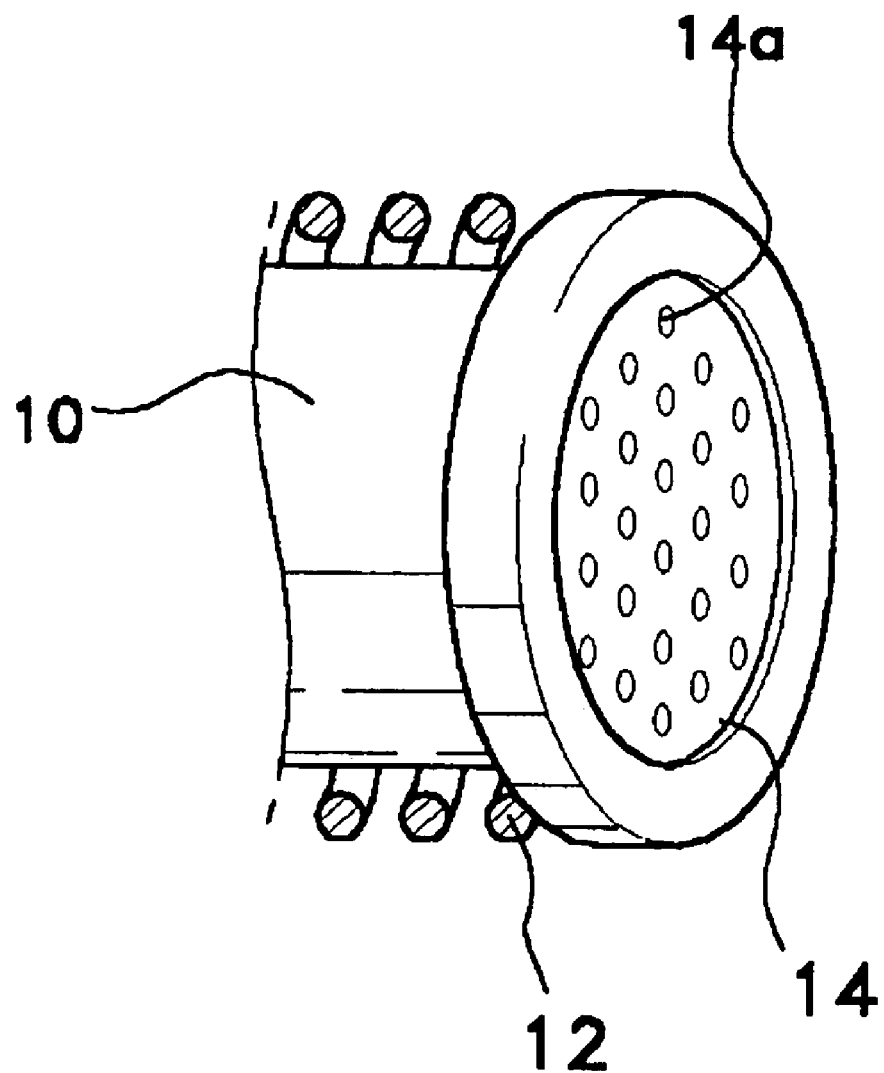
FIG. 2 is a schematic perspective view illustrating an ion source of the deposition apparatus shown in FIG. 1.
Figure 3:
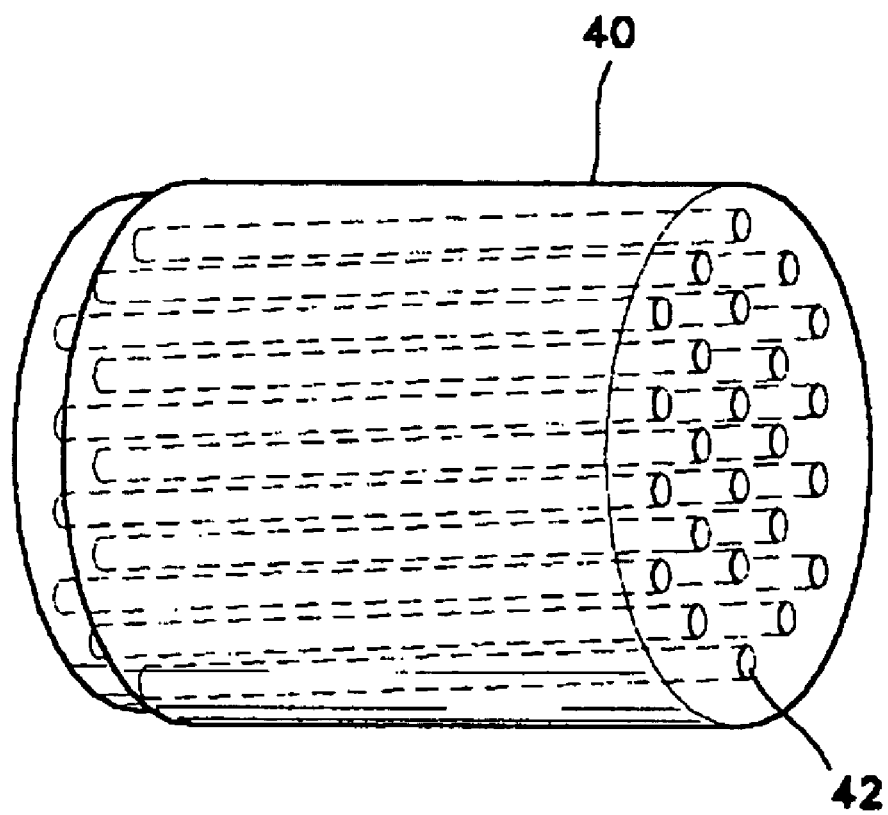
FIG. 3 is a schematic perspective view illustrating a neutral beam generating part (a reflective body) of the deposition apparatus shown in FIG. 1.

FIG. 1 is a schematic diagram illustrating an apparatus for depositing an atomic layer using a neutral beam in accordance with an exemplary embodiment of the present invention, FIG. 2 is a perspective view illustrating an ion source and a grid shown in FIG. 1, and FIG. 3 is a perspective view illustrating a reflective body shown in FIG. 1.

One aspect of the present invention provides more preferable conditions than the ALD process of a nanometer-scale semiconductor device on the theoretical basis of a neutral beam, which will be described with reference to FIGS. 1 to 3.

In FIG. 1, an ion beam generated from an ion source 10 passes through a plurality of grid holes 14a. Then, the ion beam is reflected on an inner surface of each reflective body hole 42, converted into a neutral beam, and finally radiates a specific material layer on a substrate 20 to be treated.

The ion source 10 functions to generate the ion beam from various reaction gases injected through a gas inlet 11. In the present exemplary embodiment, the ion source 10 employs an inductively coupled plasma (ICP) generator, a capacitively coupled RF ion source, a helical wave bond ion source, a negative ion source, or an electron-cyclotron reactor (ECR), for generating plasma by applying inductive current to an induction coil 12, which may use variously deformed ion sources.

Installed at a rear end of the ion source 10 is a grid assembly 14 having the plurality of grid holes 14a through which the ion beam passes and is accelerated by an applied voltage.

A reflective body 40 for reflecting the incident ion beam to convert it into a neutral beam is securely attached to a rear end of the grid assembly 14. The reflective body 40 may be formed of a conductive material such as semiconductor, metal, and so on. Only a surface of the reflective body holes 42 in the reflective body 40 may be formed of the conductive material. In addition, the reflective body 40 may be formed of a mirror surface of a conductive material such as diamond like carbon (DLC), glassy carbon, and so on, or a metal substrate.

Meanwhile, the reflective body holes 42 are tilted to a certain angle with respect to the ion beam such that the ion beam passing straight through the grid holes is reflected inside the reflective body holes 42.

The reflective body 40 is preferably ground in order to discharge charges generated by the incident ion beam. In addition, while the reflective body 40 is shown in FIG. 3 to have a cylindrical shape, its shape is not limited and may be rectangular or polygonal.

Further, while the reflective body holes 42 are also shown in FIG. 3 to have a cylindrical shape, their shape too is not limited and may be rectangular or polygonal.

In particular, when an etching apparatus is manufactured, as disclosed in Korean Patent Application No. 2003-42116, filed on Jun. 26, 2003 by the present applicant, slits are formed in the reflective body, instead of the reflective body holes. Using the slits, it is possible to overcome problems due to a narrow space of the reflective body. Herein, "reflection boy holes" includes various shapes of reflective body holes and slits.

Meanwhile, the reflective body holes are tilted such that the ion beam passing straight through the grid holes is reflected inside the reflective body holes 42 only once. In the exemplary embodiment, the reflective body holes are tilted such that the ion beam is incident on the inner surface of the reflective body holes at an incident angle of no more than 15°, and preferably 3°-15°. The incident angle of the ion beam having a range of 3°-15° means that the ion beam is incident at an angle of 75°-87° with respect to the inner surface of the reflective body holes.

In addition, the neutral beam reflected by the surface of the reflective body 40 inside the reflective body holes 42 has a reflection angle of no more than 40°, and preferably 5°-40°.

According to the above-referenced prior application of the present applicant, it will be appreciated that an optimal amount of neutral beam flux can be obtained by adjusting the incident angle and reflection angle.

Meanwhile, a substrate 20 to be treated is disposed on a propagation path of the neutral beam reflected and converted by the reflective body 40. The substrate 20 is mounted on a stage 60 in a reaction chamber 50 maintained in a constant vacuum state by a vacuum device (not shown). The stage 60 may be disposed in a direction perpendicular to the neutral beam and capable of tilting to control the angle of the substrate 20 according to the kind of deposition process. In addition, a gas inlet 51 is formed in the reaction chamber 50 to inject various gases, and a heater 61 is installed at the stage 60 to heat the substrate 20.

An ALD process performed in an atomic layer deposition apparatus using a neutral beam in accordance with an exemplary embodiment of the present invention will now be described.

In the present exemplary embodiment, a halogenic element that is not chemisorbed onto the substrate 20 is selected. Therefore, a gas containing the halogenic element is selected as a first reaction gas, a gas that can react with the halogenic element to remove it from the substrate is selected as a second reaction gas, and a purge gas for purging the reaction chamber 50 of the halogenic element and other byproducts is selected as an inert gas that does not react with a material deposited on the substrate 20. The above gases may vary in different embodiments of the invention.

Hereinafter, method of depositing a thin layer using an ALD process in accordance with an exemplary embodiment of the present invention will be described with reference to FIGS. 4A to 4D, which are cross-sectional views showing steps of treating a substrate 20 according to the method.

Figure 4:
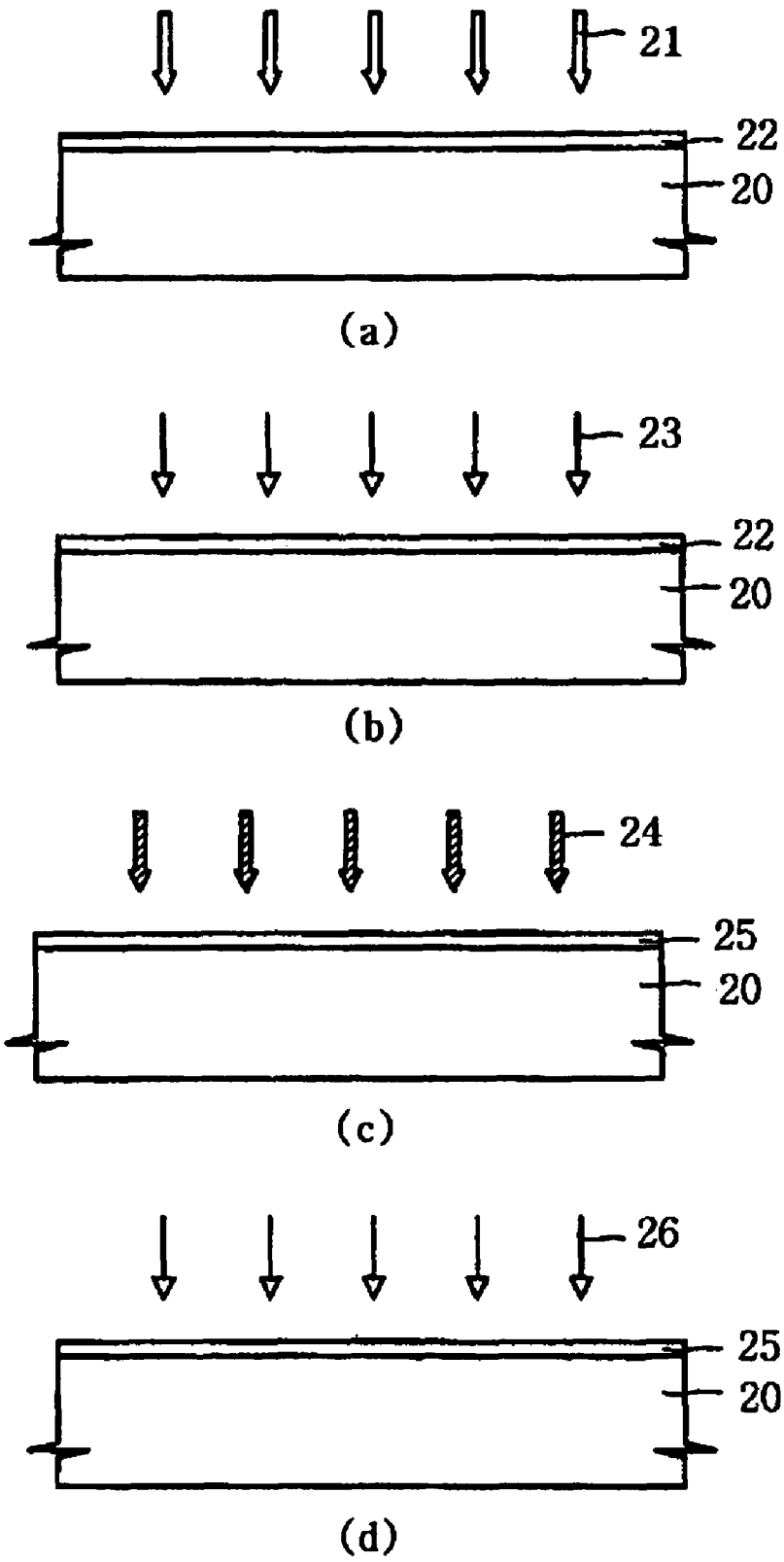
FIG. 4 is a flowchart showing a process of depositing an atomic layer using the atomic layer deposition apparatus shown in FIG. 1.

First, referring to FIG. 4A, a first reaction gas 21 required to form a thin layer for manufacturing a semiconductor device is supplied onto the substrate 20 to form a first reactant adsorption layer 22. The first reaction gas 21 is a precursor generally containing a halogenic element such as Cl. As a result, the first reactant adsorption layer 22 containing a halogenic element chemisorbed onto the substrate 20 is formed (a first reaction gas process).

The first reaction gas process will be described below in detail.

After loading the treated substrate 20 onto the stage 60 including the heater 61 in the reaction chamber 50, the heater 61 is operated to maintain the reaction chamber 50 or the substrate 20 at a temperature of no more than 450° and a chamber pressure of no more than 1 torr. In this state, a first reaction gas 21 required to form a silicon layer, e.g., $SiCl_4$, is supplied into the reaction chamber 50 through the inlet 51 for 60 seconds. As a result, a first reactant adsorption layer 22 having Si—Cl bonds in which a silicon atom is chemisorbed is formed on the substrate 20.

Meanwhile, according to the kind of thin layer to be formed on the substrate 20, the first reaction gas may be a metal-halogenic element such as $SiCl4$, $TiCl_4$, $SiH_2Cl_2$, $Si_2Cl_6$, $TaCl_3$, $AlCl_3$, $Al(CH_3)_2Cl$, $ZrCl_4$, $HfCl_4$ and so on.

For example, when a silicon nitride layer or a silicon oxide layer is to be formed on the substrate 20, a silicon source gas such as $SiCl_4$, $SiH_2Cl_2$ or $Si_2Cl_6$ may be supplied as the first reaction gas 21. When a $Ta_2O_5$ layer is to be formed on the substrate 20, $TaCl_3$ may be supplied as the first reaction gas 22. In addition, when an $Al_2O_3$ layer is to be formed on the substrate 20, $AlCl_3$ may be supplied as the first reaction gas 21.

Meanwhile, using the first reaction gas, a single atomic layer such as Si, a nitride layer such as TiN, SiN, ZrN, TaN, GaN, WN, WBN, $Ya_3N_5$, WSiN, TiSiN, TaSiN, AlSiN, AlTiN, and so on, a metal layer such as Al, Cu, Mo, Ir, W, Ag, Ta, Pt, Ir, and a metal oxide layer such as $Ta_2O_5$, $Ta_2O_3$, $TiO_2$, $ZrO_2$, $HfO_2$, $Ya_2O_3$, $La_2O_3$, $Nb_2O_5$, $CeO_2$, $SiO_2$, $Al_2O_3$, $In_2O_3$, $RuO_2$, $IrO_2$, $SrTiO_3$, $PbTiO_3$, $SrRuO_3$, $CaRuO_3$, (Ba, Sr)$TiO_3$, Pb(Zr, Ti)$O_3$, (Pb, La)(Zr, Ti)$O_3$, (Sr, Ca)$RuO_3$, (Ba, Sr)$RuO_3$, and so on, may be formed.

Next, referring to FIG. 4B, in order to remove byproducts remaining on the substrate, to which the first reactant adsorption layer 22 containing a halogenic element is chemisorbed, an inert gas 23 such as $N_2$, argon or helium is supplied through the inlet 51 to purge the reaction chamber 50 of byproducts (a purge process). In order to remove the byproducts, a pumping process may be used, instead of the purge process.

More specifically, an $N_2$ gas 23 is supplied for 30 seconds into the reaction chamber 50 and onto the substrate 20 having the first reactant adsorption layer 22 containing the Si—Cl bonds to remove byproducts remaining on the substrate 20 and purge the reaction chamber 50. The byproducts are discharged through an outlet (not shown).

Next, referring to FIG. 4C, a second reaction gas 24 that reacts with Cl that is not chemisorbed, for example, hydrogen gas (24), is supplied onto the substrate 20 having the first reactant adsorption layer 22 (a second reaction gas process).

Here, according to the first reaction gas which is not chemisorbed onto the substrate 20, gases such as oxygen, nitrogen, CH-based gases (for example, ammonia) and so on, may be supplied as the second reaction gas, alternatively to hydrogen.

Specifically, hydrogen gas 24 is supplied to an ion source 10 through an inlet 11 of the ion source 10, ionized by means of an RF device 12, accelerated to a reflective body 40 thereunder, and reflected by surfaces of the reflection holes 42 in the reflective body 40 to generate a neutral beam. Here, the neutralization reaction may be generated by re-bonding or charge exchange, or the like, as well as the reflective body.

Then, the neutral beam reacts with a halogenic element, i.e., Cl, bonded to the first reactant adsorption layer 22 to remove the halogenic element from the first reactant adsorption layer 22 so that the second reactant adsorption layer 25 from which the halogenic element is removed remains on the substrate 20.

Here, the neutral beam is supplied for 60 seconds onto the substrate 20 on which the first reactant adsorption layer 22 is formed, and 40 Watts of RF power is applied to the RF device 12. At this time, a Cl atom is bonded to a hydrogen atom to form HCl and be separated from the first reactant adsorption layer 22, and the second reactant adsorption layer 25 formed purely of silicon remains on the substrate 20.

Then, referring to FIG. 4D, byproducts remaining on the substrate 20, on which the second reactant adsorption layer 25 without the halogenic element is deposited, are removed (a purge process). As described with reference to FIG. 4D, the byproducts are purged using an inert gas 26 or removed using a pumping process.

Specifically, in order to remove byproducts (HCL) remaining on the substrate 20, into which the second reactant adsorption layer 25 containing a halogenic element is chemisorbed, an inert gas 26 such as Cl is supplied through the inlet 51 to purge the reaction chamber 50 of the byproducts. In order to remove the byproducts, a pumping process may be used, instead of the purge process.

More specifically, $N_2$ gas is supplied for 30 seconds onto the substrate 20, on which the second reactant adsorption layer 25 containing HCL is formed, to remove the byproducts remaining on the substrate 20 and purge the chamber. The byproducts are discharged through an outlet (not shown).

Meanwhile, a cycle comprised of the processes described with reference to FIGS. 4A to 4D is repeated several times until a thin layer of desired thickness is obtained.

Therefore, the second reactant adsorption layer 25, e.g., a predetermined thickness of silicon layer 25, is deposited on the substrate 20.

As can be seed from the foregoing, in the atomic layer deposition apparatus using a neutral beam and method of depositing an atomic layer using the apparatus in accordance with the present invention, it is possible to perform an ALD process without damage due to charging, at low temperature, by neutralizing various reactive or non-reactive energetic ions using reflection, re-bonding, and charge exchange with a material, and adapting the ions to the ALD process. In this process, materials such as a basic single atomic layer containing Si, and so on, various nitrides, metal oxides, and metal layers may be effectively deposited to form a gate dielectric layer (an oxide layer), a gate electrode, a capacitor electrode, a capacitor dielectric layer, a diffusion barrier layer, a metal interconnection, and so on, in the manufacture of semiconductor devices.

While this invention has been described in detail with reference to exemplary embodiments thereof, it will be apparent to those of ordinary skill in the art that various changes in form and detail may be made without departing from the scope and spirit of the invention as set forth in the appended claims.

What is claimed is:

1. A method of depositing an atomic layer using a neutral beam, the method comprising:
   supplying a first reaction gas containing a material that cannot be chemisorbed onto a substrate to be treated into a reaction chamber in which the substrate is loaded, and forming a first reactant adsorption layer containing the material that cannot be chemisorbed onto the substrate; and
   radiating a neutral beam generated by a second reaction gas onto the substrate on which the first reactant adsorption layer is formed, and removing the material not chemisorbed onto the substrate from the first reactant adsorption layer to form a second reactant adsorption layer.

2. The method of depositing an atomic layer using a neutral beam according to claim 1, wherein the neutral beam is generated by reflecting an energetic ion beam from a reflective body.

3. The method of depositing an atomic layer using a neutral beam according to claim 1, further comprising, after at least one of forming the first reactant adsorption layer or forming the second reactant adsorption layer, injecting an inert gas into the reaction chamber to purge the reaction chamber of byproducts generated during formation of the first and second reactant adsorption layers.

4. The method of depositing an atomic layer using a neutral beam according to claim 1, wherein the first reaction gas injected during the formation of the first reactant adsorption layer is a gas of a metal-halogen element.

5. The method of depositing an atomic layer using a neutral beam according to claim 1, wherein the second reaction gas is any one selected from hydrogen, oxygen, nitrogen, and a NH-based gas such as ammonia.

6. The method of depositing an atomic layer using a neutral beam according to claim 5, wherein the neutral beam radiated onto the substrate during the formation of the second reactant adsorption layer ionizes hydrogen, oxygen, nitrogen, and a NH-based gas such as ammonia using an ion source to form an ion beam, and the ion beam is converted into the neutral beam by reflection from a reflective body.

7. The method of depositing an atomic layer using a neutral beam according to claim 3, wherein the inert gas injected to purge the reaction chamber is one of argon, nitrogen, and helium.

8. The method of depositing an atomic layer using a neutral beam according to claim 3, wherein the formation of the first reactant adsorption layer, the purging of the reaction chamber of byproducts, the formation of the second reactant adsorption layer, and the purging of the reaction chamber of byproducts are repeated as one cycle.

9. A method of depositing an atomic layer using a neutral beam that enables deposition of a single atomic layer containing Si, nitride, metal oxide, or a metal layer, the method comprising:
   supplying a first reaction gas containing a material that cannot be chemisorbed onto a substrate to be treated into a reaction chamber in which the substrate is loaded, and forming a first reactant adsorption layer containing the material that cannot be chemisorbed onto the substrate; and
   radiating a neutral beam generated by a second reaction gas onto the substrate on which the first reactant adsorption layer is formed, and removing the material not chemisorbed onto the substrate from the first reactant adsorption layer to form a second reactant adsorption layer.

* * * * *